United States Patent
Pinckley et al.

(10) Patent No.: US 7,333,561 B2
(45) Date of Patent: Feb. 19, 2008

(54) POSTDISTORTION AMPLIFIER WITH PREDISTORTED POSTDISTORTION

(75) Inventors: Danny Thomas Pinckley, Arlington, TX (US); Sean Michael McBeath, Keller, TX (US)

(73) Assignee: Motorola, Inc., Schaumburg, IL (US)

( * ) Notice: Subject to any disclaimer, the term of this patent is extended or adjusted under 35 U.S.C. 154(b) by 864 days.

(21) Appl. No.: 10/185,229

(22) Filed: Jun. 28, 2002

(65) Prior Publication Data

US 2004/0001559 A1 Jan. 1, 2004

(51) Int. Cl.
*H04K 1/02* (2006.01)
(52) U.S. Cl. .................... 375/297; 455/114.3
(58) Field of Classification Search ........ 375/295–297; 455/63.1, 67.13, 114.2, 114.3; 330/149, 330/151
See application file for complete search history.

(56) References Cited

U.S. PATENT DOCUMENTS

| | | | |
|---|---|---|---|
| 5,574,400 A * | 11/1996 | Fukuchi | 330/52 |
| 5,808,512 A * | 9/1998 | Bainvoll et al. | 330/151 |
| 5,923,712 A * | 7/1999 | Leyendecker et al. | 375/297 |
| 5,959,500 A * | 9/1999 | Garrido | 330/151 |
| 6,075,411 A * | 6/2000 | Briffa et al. | 330/149 |
| 6,104,241 A * | 8/2000 | Cova et al. | 330/149 |
| 6,188,732 B1 | 2/2001 | Rha | |
| 6,545,535 B2 * | 4/2003 | Andre | 330/149 |
| 6,819,173 B2 * | 11/2004 | Louis et al. | 330/149 |
| 6,979,139 B2 * | 12/2005 | Hine et al. | 400/76 |
| 6,985,704 B2 * | 1/2006 | Yang et al. | 455/126 |
| 7,170,951 B1 * | 1/2007 | Perthold et al. | 375/296 |
| 2002/0012404 A1 * | 1/2002 | Ahn | 375/297 |

OTHER PUBLICATIONS

McBeath. S.M. et al. "W-CDMA Power Amplifier Modeling". IEEE Vehicular Technology Conference, 2001. VTC 2001 Fall. IEEE VTS 54th, vol. 4, 2001. pp. 2243-2247.

* cited by examiner

*Primary Examiner*—Khanh C. Tran
(74) *Attorney, Agent, or Firm*—Steven May

(57) ABSTRACT

A postdistortion amplifier that produces a postdistortion amplifier output signal based on a signal input to the postdistortion amplifier reduces distortion in the postdistortion amplifier output signal by digitally predistorting an error signal. The postdistortion amplifier includes a digital predistortion unit that receives a digital error signal and produces a digital predistorted error signal based on the received digital error signal and by reference to a predistorted error signal model.

41 Claims, 5 Drawing Sheets

POSTDISTORTION AMPLIFIER WITH PREDISTORTED POSTDISTORTION

FIELD OF THE INVENTION

The present invention relates generally to wireless communication devices, and in particular to a transmitter portion of a wireless communication device.

BACKGROUND OF THE INVENTION

The frequency spectrum that is shared among radio communication devices is limited. Thus the ability of a transmitter to transmit as much information as possible in an allocated frequency spectrum or channel without interfering with other communication devices in adjacent channels is of great importance. To transmit as much information as possible in the allocated channel, digital communication systems typically modulate both the amplitude and phase of a radio frequency (RF) carrier. The amplitude modulation allows more information to be encoded on the carrier in a given channel than if only the phase was modulated. However, the amplitude modulation puts additional requirements on the transmitter that would not exist if only the phase of the RF carrier was modulated.

These additional requirements are due to the inherent nonlinear effects resulting from the amplification of an amplitude modulated signal by an RF power amplifier. Due to the nonlinear characteristics of the RF power amplifier, signal distortion components that include an amplitude component and a phase component are added to the original signal. These additional components are due to the amplitude compression characteristics (AM/AM) and the phase distortion (AM/PM) characteristics of the RF power amplifier when it is driven over a range of amplitudes. If these distortion components are not compensated they will cause spreading of the spectrum into the adjacent channels and thus interfere with communication devices using adjacent channels.

A number of prior art signal processing techniques have been developed to compensate for the nonlinear characteristics of RF power amplifiers. One such technique involves the use of a feed forward correction circuit in a feed forward amplifier, also known as post-distortion. In general, feed forward amplifiers separate out distortion components generated by the RF power amplifier to create an error signal. The error signal is then amplified and added to the RF power amplifier's output with an amplitude, phase, and delay adjusted for maximum cancellation of the distortion components. However, the amount of distortion reduction available in a feed forward amplifier is limited by the distortion introduced into the amplified error signal by an error amplifier.

In order to compensate for the distortion introduced to the error signal, a technique of pre-distorting the error signal was proposed by Cova, et al., in U.S. Pat. No. 6,104,241. Cova includes a traditional feed forward amplifier in which an RF input signal is amplified by a main amplifier to produce an RF output signal that includes distortion components. The RF output signal is sampled to produce a sampled output signal that is fed to a feed forward correction circuit. In the feed forward correction circuit, the sampled output signal is combined with a delayed sample of an RF input signal in order to produce an error signal that comprises isolated distortion components. The error signal is then fed to an error amplifier that amplifies the error signal and feeds the amplified error signal into a combiner at the output of the main amplifier. The combiner combines the amplified error signal with the main amplifier output signal, thereby providing cancellation of distortion components in the main amplifier output signal.

In order to compensate for distortion introduced to the amplified error signal by the error amplifier, Cova provides a predistorter at an input to the error amplifier. Samples of the main amplifier output signal and the RF input signal are also fed to a distortion detector. Based on the main amplifier output signal and the RF input signal, the distortion detector detects a distortion energy of the main amplifier output signal and provides a measure of the energy to a digital signal processor (DSP). The DSP determines weighting coefficients based on the detected distortion energy of the main amplifier output signal, which weighting coefficients are used to control a variable attenuator and a phase shifter in the predistorter that predistort the error signal by adjusting a gain and phase of the signal, thereby compensating for distortion introduced to the error signal by the error amplifier and reducing the detected distortion energy of the main amplifier output signal.

A problem with the predistortion proposed by Cova is that it is a hardware implementation that operates at RF and predistorts an error signal by use of a variable attenuator and a phase shifter. Cova's predistortion loop is an adaptive feedback loop that continually feeds back the amplified error signal and continually modulates the error signal based on the fed back amplified error signal. This technique is expensive to implement, particularly as more weighting coefficients are generated, requiring additional hardware, in an effort to improve the accuracy of the amplitude and phase adjustment of the error signal in order to produce a predistorted error signal. Furthermore, the modulation of the error signal by a variable attenuator and a phase shifter introduces additional distortion and injects a variable group delay in the forward path of the error signal, which is undesirable in a feedforward error correction system. In addition, the technique proposed by Cova performs distortion correction of the error signal at RF. The informational content of the signal is the baseband signal that has been modulated onto an RF carrier. Precision may be lost when the baseband signal is first modulated onto an RF carrier and then the modulated RF carrier is corrected in main and feed forward signal paths with predistortion.

Therefore a need exists for a method and apparatus for minimizing the distortion introduced into an error signal by the feed forward correction circuit.

DESCRIPTION OF A PREFERRED EMBODIMENT

Figure 1:
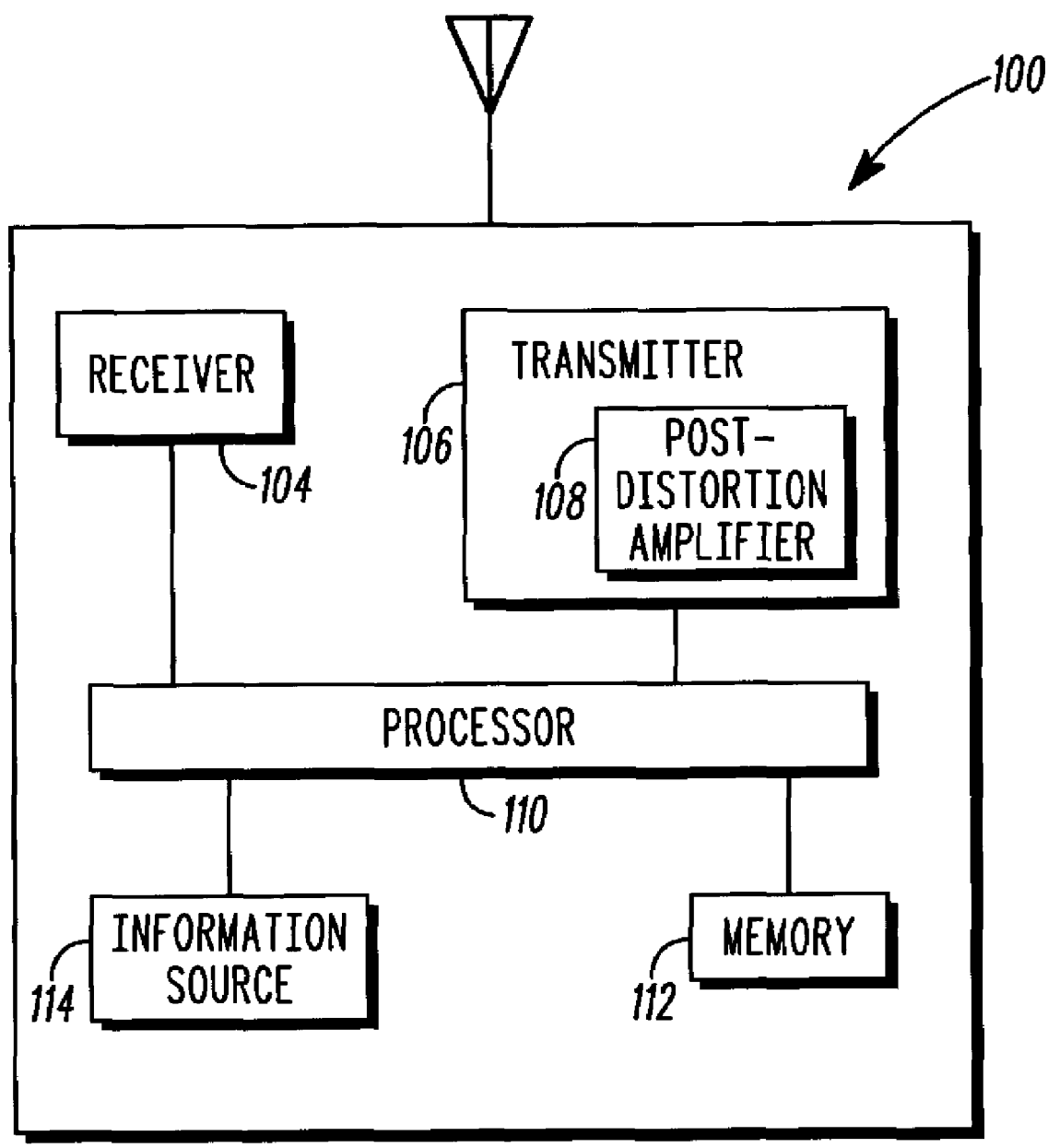
FIG. 1 is a block diagram of a communication device in accordance with an embodiment of the present invention.

To address the need for a method and apparatus for minimizing the distortion introduced into an error signal by a postdistortion correction circuit, a postdistortion amplifier digitally predistorts the error signal. The postdistortion amplifier includes a digital predistortion unit that receives a digital error signal and produces a digital predistorted error signal based on the received digital error signal and by reference to a predistorted error signal model.

Generally, the present invention encompasses an apparatus for predistorting an error signal in a postdistortion amplifier. The apparatus includes a predistorted error signal model and a digital predistortion unit that receives a digital error signal and produces a digital predistorted error signal based on the received digital error signal and by reference to the predistorted error signal model.

Another embodiment of the present invention encompasses a method for predistorting an error signal in a postdistortion amplifier that receives a digital input signal and produces a linearized amplified signal based on the digital input signal. The method includes steps of maintaining a predistorted error signal model, producing a digital error signal based on the digital input signal, and producing a digital predistorted error signal based on the received digital error signal and by reference to the predistorted error signal model.

Yet another embodiment of the present invention provides a postdistortion amplifier that includes a main signal path, a postdistortion correction circuit that is coupled to the main signal path, and a signal combiner that is coupled to each of the main signal path and the postdistortion correction circuit. The main signal path receives a digital input signal and produces an amplified signal in response to receiving the digital input signal. The postdistortion correction circuit receives at least a portion of the digital input signal, stores a characterization of the main signal path, produces a digital error signal based on the at least a portion of the digital input signal and the characterization of the main signal path, predistorts the digital error signal based on a predistorted error signal model to produce a digital predistorted error signal, and produces an amplified error signal based on the predistorted error signal, wherein the predistortion of the error signal at least partially cancels distortion introduced by the postdistortion correction circuit to the amplified error signal. The signal combiner receives the amplified signal from the main signal path, receives the amplified error signal from the postdistortion correction circuit, and combines the amplified signal with the amplified error signal to produce a postdistortion amplifier output signal.

Yet another embodiment of the present invention provides a wireless communication device that includes an information source that sources information to a processor, a processor that receives the information from the information source, produces a digital input signal based on the received information, and couples the digital input signal to a postdistortion amplifier, and a postdistortion amplifier that receives the digital input signal from the processor and produces a linearized amplified signal based on the digital input signal. The postdistortion amplifier includes a main signal path, a postdistortion correction circuit that is coupled to the main signal path, and a signal combiner that is coupled to each of the main signal path and the postdistortion correction circuit. The main signal path of the postdistortion amplifier receives the digital input signal and produces an amplified signal in response to receiving the digital input signal. The postdistortion correction circuit of the postdistortion amplifier receives at least a portion of the digital input signal, stores a characterization of the main signal path, produces a digital error signal based on the at least a portion of the digital input signal and the characterization of the main signal path, predistorts the digital error signal based on a predistorted error signal model to produce a digital predistorted error signal, and produces an amplified error signal based on the predistorted error signal, wherein the predistortion of the error signal at least partially cancels distortion introduced by the postdistortion correction circuit to the amplified error signal. The signal combiner of the postdistortion amplifier receives the amplified signal from the main signal path, receives the amplified error signal from the postdistortion correction circuit, and combines the amplified signal with the amplified error signal to produce a linearized amplified signal.

The present invention may be more fully described with reference to FIGS. 1-5. FIG. 1 is a block diagram of a wireless communication device 100 in accordance with an embodiment of the present invention. Preferably, wireless communication device 100 is a base transceiver station (BTS); however, wireless communication device 100 may be any communication device capable of wirelessly transmitting information, such as a cellular telephone, a radiotelephone, or a wireless modem. Communication device 100 includes an antenna 102 coupled to each of a receiver 104 and a transmitter 106 having a postdistortion, or model-based feed forward, amplifier 108. Communication device 100 further includes a processor 110, such as one or more microprocessors, microcontrollers, digital signal processors (DSPs), combinations thereof or such other devices known to those having ordinary skill in the art, that is coupled to one or more memory devices 112, such as random access memory (RAM), dynamic random access memory (DRAM), and/or read only memory (ROM) or equivalents thereof, that store data and programs that may be executed by the processor. Processor 110 is further coupled to each of receiver 104, transmitter 106, and an information source 114. Information source 114 can include an interface with devices or networks external to communication device 100, or alternatively, in the case of a cellular telephone or a radiotelephone, may be a user interface, or in another alternative embodiment may be included in processor 110 and may be an application running on the processor.

Information source 114 or receiver 104 sources information to processor 110. Processor 110 processes the information in accordance with well-known signal processing techniques and then conveys a digital signal comprising the processed information to transmitter 106. Transmitter 106 routes the RF signal to postdistortion amplifier 108, which amplifier modulates the information onto a radio frequency (RF) carrier to produce an RF signal and amplifies the RF signal for transmission via antenna 102.

Figure 2:
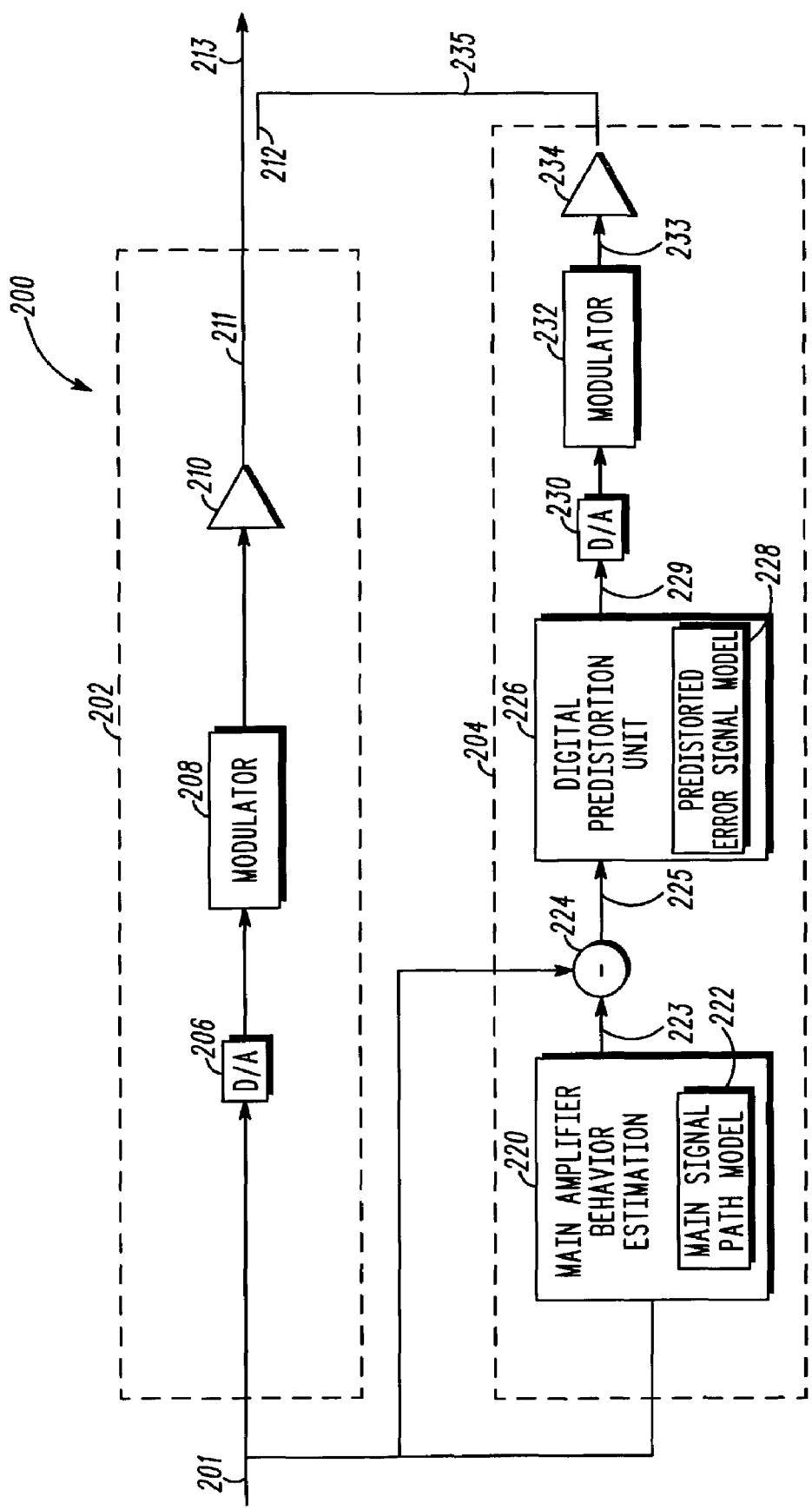
FIG. 2 is a block diagram of a postdistortion amplifier in accordance with an embodiment of the present invention.

FIG. 2 is a block diagram of a postdistortion amplifier 200 in accordance with an embodiment of the present invention. Postdistortion amplifier 200 includes a main signal path 202 that is coupled to a postdistortion correction circuit 204. A complex, digital input signal 201 that includes a complex component comprising an in-phase (I) component and a quadrature (Q) component is coupled to postdistortion amplifier 200, preferably by processor 110. Postdistortion amplifier 200 couples input signal 201 to each of main signal path 202 and postdistortion correction circuit 204. Main signal path 202 then routes the received input signal to a digital-to-analog converter (D/A) 206 that converts the amplitude and phase adjusted input signal to an analog signal to produce an analog input signal. D/A 206 preferably includes dual converters, that is, a converter for the in-phase component of input signal 201 and a converter for the quadrature component of input signal 201.

D/A 206 conveys the analog input signal to a modulator 208, preferably an I/Q modulator, that modulates the complex input signal onto an RF carrier to produce an RF input signal. Modulator 208 conveys the RF input signal to an RF power amplifier 210 that amplifies the signal to produce a main signal path output signal, that is, amplified signal 211. Amplified signal 211 includes a carrier component that has been modulated by the complex baseband component of input signal 201 and further includes distortion components introduced to the amplified signal by RF power amplifier 210. RF power amplifier 210 then conveys amplified signal 211 to a signal combiner 212, preferably a directional coupler. Signal combiner 212 combines amplified signal 211 with an amplified error signal 235 output by postdistortion correction circuit 204 to produce a postdistortion amplifier output signal 213. As mentioned above, RF power amplifier 210 introduces distortion components to amplified signal 211, which distortion components are partially cancelled by amplified error signal 235. The distortion components are due to the amplitude compression characteristics and the phase distortion characteristics of RF power amplifier 210 when the power amplifier is driven over a range of amplitudes, and if not compensated may cause spreading of the spectrum into the adjacent channels and thus interfere with communication devices using adjacent channels.

Processor 110 introduces multiple delays to the input signals 201 provided to D/A 206 and postdistortion correction circuit 204. A delay of the multiple delays is designed to compensate for a difference between a time delay of D/A 206, modulator 208, and RF power amplifier 210 and a time delay of a Main Amplifier Behavior Estimation unit (MABE) 220, a summation junction 224, a digital predistortion unit 226, a D/A 230, a modulator 232 and an error amplifier 234, thereby facilitating a cancellation of the distortion components of amplified signal 211 by amplified error signal 235. Another delay of the multiple delays is designed to compensate for a time delay introduced by MABE 220 to the digital estimate 223 of the complex baseband component of amplified signal 211 that is conveyed by MABE 220 to summation junction 224, thereby facilitating a cancellation of the input signal component of signal 223 by input signal 201 as described below. In one embodiment of the present invention, the delays may be determined in the factory and fixed. In another embodiment of the present invention, such as the embodiments described below with reference to FIGS. 3 and 4 wherein a postdistortion amplifier output signal 213 is sampled, fed back, and downconverted, processor 110 may adaptively adjust the delays introduced to each of the input signals 201 provided to each of D/A 206 and postdistortion correction circuit 204 to optimize a cancellation of the distortion components of amplified signal 211 by amplified error signal 235.

Postdistortion correction circuit 204 produces amplified error signal 235 based on input signal 201 and a characterization of main signal path 202. Postdistortion correction circuit 204 includes Main Amplifier Behavior Estimation unit (MABE) 220, summation junction 224 coupled to MABE 220, digital predistortion unit 226 coupled to the summation junction, digital-to-analog converter (D/A) 230 coupled to the error amplifier predistortion unit, modulator 232 coupled to D/A 230, and error amplifier 234 coupled to the RF modulator. Preferably, MABE 220, summation junction 224, and digital predistortion unit 226 are each implemented in processor 110. The functions of MABE 220, summation junction 224, and digital predistortion unit 226 are preformed by the execution, by processor 110, of algorithms stored in the one or more memory devices 112 or in a memory associated with processor 110.

The operation of postdistortion correction circuit 204 is as follows in accordance with an embodiment of the present invention. Postdistortion correction circuit 204 routes the input signal 201 received from processor 110 to each of MABE 220 and summation junction 224. Based on input signal 201, MABE 220 then produces a digital estimate 223 of the complex baseband component of the amplified signal 211 produced by main signal path 202 in response to receiving input signal 201. Similar to amplified signal 211, digital estimated signal 223 includes a complex baseband component around the carrier and further includes complex baseband distortion components introduced to amplified signal 211 by RF power amplifier 210. In addition, digital estimated signal 223 may include gain adjustments and/or phase adjustments relative to amplified signal 211 so as to facilitate an optimal cancellation of the carrier component of signal 223 by the input signal 201 at summation junction 224.

MABE 220 produces digital estimated signal 223 by reference to a model, or a characterization, 222 of main signal path 202 that is associated with MABE 220. Main signal path model 222 may be included in the one or more memory devices 112 or may be included in a memory associated with processor 110. In response to receiving a first parameter associated with input signal 201, main signal path model 222 generates a parameter that corresponds to a digital estimate of a corresponding amplified signal produced by main signal path 202, such as amplified signal 211.

In one embodiment of the present invention, main signal path model 222 comprises a look-up table. The look-up table includes amplitudes and phases corresponding to a signal input to main signal path 202, such as input signal 201, and associated amplitudes and phases of a corresponding amplified signal produced by main signal path 202, such as amplified signal 211. For example, for an input signal of amplitude $A_{in}$ and phase $P_{in}$, the look-up table provides a corresponding amplitude $A_{out}$ and phase $P_{out}$. The amplitude $A_{out}$ and the phase $P_{out}$ are estimates of the amplitude and phase of an amplified signal produced by main signal path 202 in response to receipt by the main signal path of an input signal with amplitude $A_{in}$ and phase $P_{in}$. However, those who are of ordinary skill in the art realize that the variety of parameters stored in the look-up table, such as amplitude $A_{in}$, and the corresponding parameters output by the look-up table, such as a corresponding amplitude $A_{out}$, is up to the designer of the postdistortion amplifier 200 and can be one, two, or any number of varieties of parameters.

In another embodiment of the present invention, main signal path model 222 may comprise an algorithm, such as a transfer function based on curve-fit equations that are generated during a testing of transmitter 106, that characterizes a behavior of main signal path 202. When an amplitude $A_{in}$ and a phase $P_{in}$ of signal input to MABE 220 are input into the algorithm, the algorithm generates an amplitude $A_{out}$ and a phase $P_{out}$ that are an estimate of the amplitude and phase of a corresponding amplified signal produced by main signal path 202. The values stored in the look-up table, or one or more equations underlying the algorithm, may be determined in a factory based on factory testing of transmitter 106, or may comprise a table of predetermined values or a set of predetermined curve-fit equations that are prepared by a designer of transmitter 106.

In yet another embodiment of the present invention, main signal path model 222 may be a model with memory, wherein the model may be an algorithm or a look-up table that stores amplitudes and phases corresponding to a signal input to main signal path 202, such as input signal 201, and associated amplitudes and phases of a corresponding amplified signal produced by main signal path 202, such as amplified signal 211. When an input signal of amplitude $A_{in}$ and phase $P_{in}$ is input into the model, the model generates a corresponding amplitude $A_{out}$ and phase Pout-that are estimates of a complex baseband component of an amplified signal produced by main signal path 202 and are based on input signal amplitude $A_{in}$ and phase $P_{in}$ and are further based on one or more input amplitudes $A_{in}$ and/or phases $P_{in}$ previously input into the model. For example, a tapped-delay-line (TDL) model is a simple non-linear model with memory that may be used herein. A tapped-delay-line model represents the current output of the main signal path as a summation of polynomials of the current and prior inputs into the model, that is, the main signal path. Mathematically, the modeled outputs are given by $$A_{out}(n) = \sum_{m=0}^{ml} \sum_{p=0}^{po-1} a_{m,p} A_{in}^{po-p}(n-m) + a_{ml+1,po}$$

$$P_{out}(n) = \sum_{m=0}^{ml} \sum_{p=0}^{po-1} b_{m,p} A_{in}^{po-p}(n-m) + b_{ml+1,po}$$

where $A_{out}$ and $P_{out}$ are the modeled outputs, $A_{in}$ is the measured input, ml is the memory length, po is the order of the polynomials, and the a's and b's are the model coefficients. It may be noted that the TDL model reduces to a classical polynomial model when the memory length ml is zero. The TDL model coefficients can be found using the well-known least squares technique.

By referencing model 222, MABE 220 is able to produce a digital estimate 223 of the complex baseband component of amplified signal 211 when input signal 201 is sourced to the MABE. When input signal 201 is in a Cartesian representation, that is, is represented by an in-phase component and quadrature component, a Cartesian-to-polar converter included in MABE 220 converts the input signal to a polar representation, that is, to an amplitude and phase representation. MABE 220 then produces a digital estimate of the complex baseband component of amplified signal 211 based on the amplitude and phase representation of input signal 201. A polar-to-Cartesian converter included in MABE 220 then converts the digital estimate of the complex baseband component of amplified signal 211 to a Cartesian representation in order to facilitate a comparison of the digital estimate of the complex baseband component of amplified signal 211 to the digital input signal 201 at summation junction 224.

MABE 220 conveys digital estimated signal 223 to summation junction 224. Summation junction 224 combines digital estimated signal 223 received from MABE 220 with the input signal 201 received from processor 110, preferably subtracting signal 223 from signal 201, to produce an error signal 225. The subtraction of the digital estimated signal 223 from input signal 201 results in a partial cancellation of the carrier component of the estimated amplified signal by the input signal. As a result, error signal 225 primarily contains the complex baseband distortion components of the digital estimated signal 223, which distortion components correspond to the complex baseband distortion components of amplified signal 211 and are designed to cancel the distortion components of amplified signal 211 at output signal combiner 212. Summation junction 224 conveys error signal 225 to digital predistortion unit 226.

Typically, in a postdistortion amplifier, the amount of distortion reduction available is limited by the distortion introduced by an error amplifier into the amplified error signal. In order to cancel out the distortion introduced by error amplifier 234 into amplified error signal 235, postdistortion amplifier 200 digitally predistorts error signal 225 in predistortion unit 226 before the error signal is applied to error amplifier 234. By predistorting error signal 225, postdistortion amplifier 200 provides compensation for the distortion introduced into amplified error signal 235 by error amplifier 234. Distortion introduced by D/A 230 and modulator 232 can also be corrected in this way.

Predistortion unit 226 includes, or is associated with, a predistorted error signal model 228. Predistorted error signal model 228 may be stored in the one or more memory devices 112 or may be stored in a memory associated with processor 110. In response to receiving a first parameter associated with error signal 225, predistorted error signal model 228 generates a parameter having at least a component that corresponds to the inverse of the distortion introduced to the error signal by error amplifier 234 and associated D/A 230 and modulator 232.

In one embodiment of the present invention, predistorted error signal model 228 comprises a look-up table that includes multiple error signal parameters, preferably amplitudes and phases of an error signal, such as error signal 225, and multiple associated predistortion parameters. The predistortion parameters maintained in the look-up table comprise amplitudes and phases that form a predistortion correction signal that is multiplied to the error signal 225 and is designed to cancel the distortion introduced to the error signal when amplified by error amplifier 234 and its associated components, D/A 230 and modulator 232. However, those who are of ordinary skill in the art realize that the variety of parameters stored in the look-up table, such as an error signal amplitude $A_{error}$ and a corresponding predistortion correction signal amplitude $A_{error\_correction}$, is up to the designer of the postdistortion amplifier and can be one, two, or any number of a variety of parameters.

For example, for an error signal of amplitude $A_{error}$ and phase $P_{error}$, the look-up table generates a corresponding amplitude $A_{error\_correction}$ and phase $P_{error\_correction}$ of a predistortion component that is to modify the error signal to produce predistorted input signal 229, represented by amplitude $A_{predistort\_signal}$ and phase $P_{predistort\_signal}$. In this implementation, the signals are related as follows.

$A_{predistort\_signal} = A_{error} * A_{error\_correction}$
$P_{predistort\_signal} = P_{error} + P_{error\_correction}$ Note that the look-up table could alternately have been constructed to directly produce $A_{predistort\_signal}$ and $P_{predistort\_signal}$ from $A_{error}$ and $P_{error}$.

In another embodiment of the present invention, predistorted error signal model 228 may be an algorithm, such as a transfer function based on curve-fit equations that are generated during a testing of transmitter 106, that characterizes a behavior of D/A 230, modulator 232, and error amplifier 234. When an amplitude $A_{error}$ and phase $P_{error}$ of an error signal are input to the algorithm stored in predistorted error signal model 228, the algorithm produces an amplitude $A_{predistort\_signal}$ and phase $P_{predistort\_signal}$ of a predistortion signal formed from the error signal and an approximation to the inverse of the transfer function of the path containing D/A 230, modulator 232, and error amplifier 234. The values stored in the look-up table, or one or more equations underlying the algorithm, may be determined in a factory based on factory testing of transmitter 106, or may comprise a table of predetermined values or a set of predetermined curve-fit equations that are prepared by a designer of transmitter 106, and stored in the factory in, or preprogrammed into, model 228.

In yet another embodiment of the present invention, predistorted error signal model 228 may be a model, such as a look-up table or an algorithm as described above, with memory. The database or algorithm produces an amplitude $A_{predistort\_signal}$ and phase $P_{predistort\_signal}$ of a predistortion signal based on an amplitude $A_{error}$ and phase $P_{error}$ of a corresponding error signal and further based on one or more error signal amplitudes $A_{error}$ and/or phases $P_{error}$ previously input into the model.

Upon receiving error signal 225, predistortion unit 226 determines at least one error signal parameter, preferably an amplitude and phase of the error signal, and further determines, with reference to predistorted error signal model 228, at least one corresponding predistortion signal parameter, preferably a corresponding amplitude and phase of a predistortion correction signal. Predistortion unit 226 then uses the determined predistortion correction signal amplitude and/or phase to modify the determined error signal 225 amplitude and/or phase to produce a digital predistorted error signal 229. When error signal 225 is in polar representation, the determined predistortion correction signal amplitude is multiplied by the determined error signal 225 amplitude to produce the digital predistortion error signal 229 amplitude, and the determined predistortion correction signal phase is added to the determined error signal 225 phase to produce the digital predistortion error signal 229 phase. When error signal 225 is in a Cartesian representation, that is, is represented by an in-phase component and quadrature component, a Cartesian-to-polar converter included in predistortion unit 226 may convert the error signal to a polar representation, that is, to an amplitude and phase representation. Predistortion unit 226 then produces a predistortion correction signal based on the amplitude and phase representation of error signal 225 and multiplies it by the polar representation of the error signal to produce a digital predistorted error signal. A polar-to-Cartesian converter included in predistortion unit 226 then may convert the digital predistorted error signal produced by predistortion unit 226 to a Cartesian representation to facilitate a combining of an amplified error signal 235 and amplified signal 211 at signal combiner 212.

In another embodiment of the present invention, the at least one predistortion signal parameter generated by predistorted error signal model in response to error signal 225 comprises an amplitude and/or phase of predistorted error signal 229. Upon receiving error signal 225, predistortion unit 226 determines an amplitude and/or phase of the error signal, either by lookup table or algorithm, and further determines, with reference to predistorted error signal model 228, a corresponding amplitude and/or phase of predistorted error signal 229. Predistortion unit 226 then substitutes the determined predistorted error signal amplitude and/or phase for the corresponding determined error signal 225 amplitude and/or phase to produce a digital predistorted error signal 229. Again, when error signal 225 is in a Cartesian representation, Cartesian-to-polar converter included in predistortion unit 226 may convert the error signal to a polar representation and a polar-to-Cartesian converter included in the predistortion unit then may convert predistorted error signal 229 back to a Cartesian representation.

Predistortion unit 226 conveys predistorted error signal 229 to D/A 230. D/A 230 converts the predistorted error signal 229 to an analog predistorted error signal and conveys the analog predistorted error signal to modulator 232. Modulator 232 modulates the received analog predistorted error signal onto an RF carrier that is approximately the same frequency as the RF carrier used to modulate input signal 201 in main signal path 202 to produce a modulated predistorted error signal 233.

Modulated predistorted input signal 233 is conveyed by RF modulator 232 to error amplifier 234. Error amplifier 234 amplifies modulated predistorted input signal 233 to produce amplified error signal 235. The distortion introduced by error amplifier 234 to amplified error signal 235 is at least partially cancelled out by the predistortion of error signal 225 performed by predistortion unit 226, with the result that amplified error signal 235 is a very accurate, upconverted analog replica of error signal 225. Error amplifier 234 conveys amplified error signal 235 to output signal combiner 212, where distortion that is introduced by RF power amplifier 210 to amplified signal 211 is at least partially cancelled by amplified error signal 235 to produce a highly linear postdistortion amplifier output signal 213 for transmission via antenna 102.

By digitally predistorting error signal 225, postdistortion amplifier 200 provides compensation for the distortion introduced into amplified error signal 235 by D/A 230, modulator 232, and error amplifier 234. By compensating for the distortion introduced into amplified error signal 235 by D/A 230, modulator 232, and error amplifier 234, postdistortion amplifier 200 reduces the distortion introduced to postdistortion amplifier output signal 213 by amplified error signal 235. Postdistortion amplifier 200 digitally predistorts error signal 225 by use of a digital predistortion unit 226 that includes, or is associated with, a predistorted error signal model 228. Model 228 may be a look-up table that stores multiple error signal parameters, preferably amplitudes and phases of an error signal, such as error signal 225, and multiple associated predistortion parameters, or may be an algorithm that generates one or more predistortion parameters based on one or more error signal parameters. By digitally predistorting error signal 225, postdistortion amplifier 200 predistorts at baseband rather than RF and does not introduce additional delay and distortion elements to the predistorted signal that are introduced by the prior art. Furthermore, by digitally predistorting a digital error signal, postdistortion amplifier 200 is able to very accurately digitally synchronize the signals 211, 235 respectively produced by each of main signal path 202 and postdistortion correction path 204, thereby improving the cancellation that occurs when signals 211 and 235 are combined.

Figure 3:
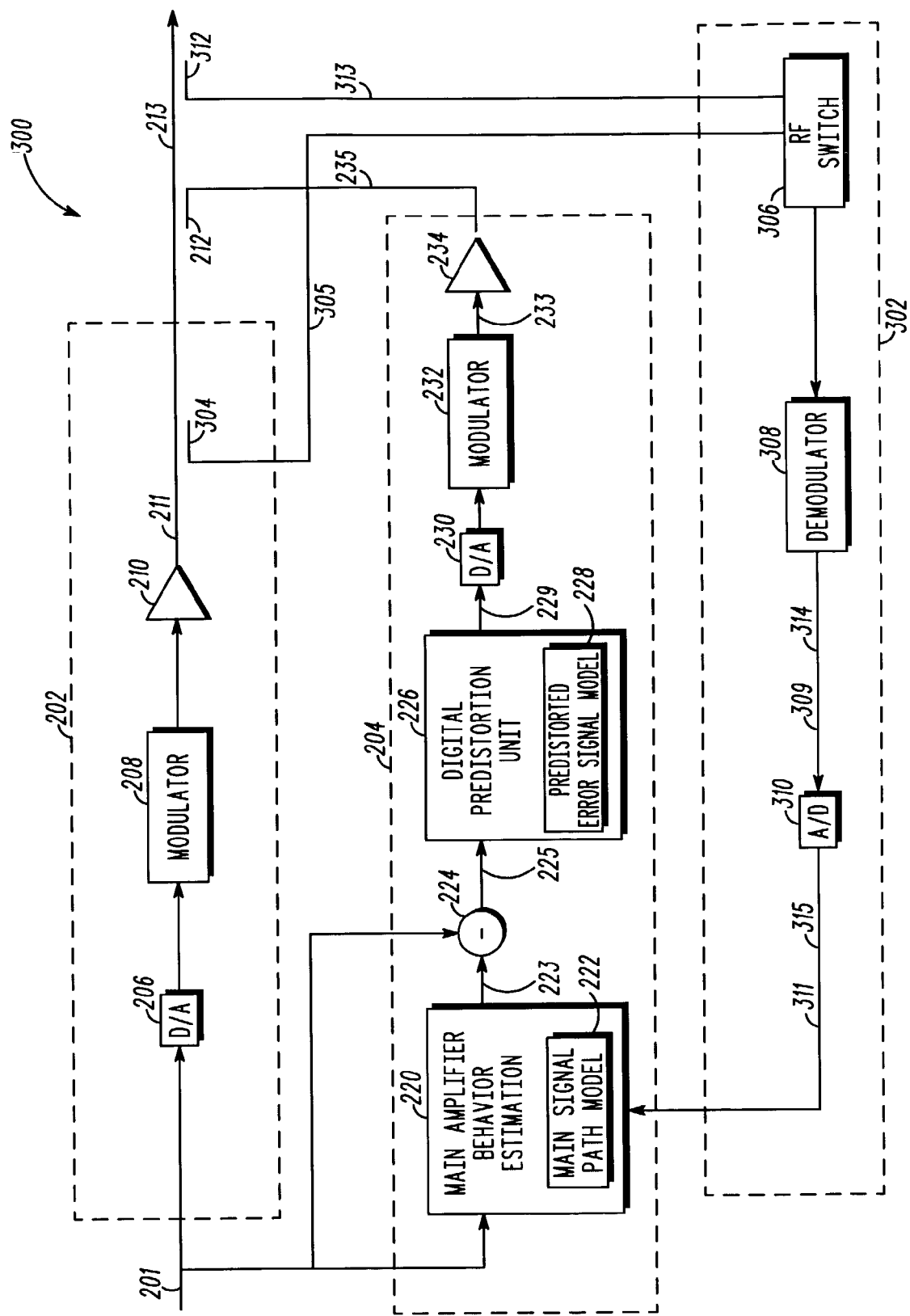
FIG. 3 is a block diagram of a postdistortion amplifier in accordance with another embodiment of the present invention.

FIG. 3 is a block diagram of a postdistortion amplifier 300 in accordance with another embodiment of the present invention. Similar to postdistortion amplifier 200, postdistortion amplifier 300 includes a main signal path 202 that produces an output signal 211 in response to receiving an input signal 201. In addition, similar to postdistortion amplifier 200, postdistortion amplifier 300 includes a postdistortion correction circuit 204 that is coupled to main signal path 200 and that produces an amplified error signal 235 in response to reception of input signal 201. However, unlike postdistortion amplifier 200, postdistortion amplifier 300 further includes a first auxiliary circuit 302 that is coupled to each of main signal path 202 and postdistortion correction circuit 204 and that facilitates a dynamic updating of main signal path model 222 of MABE 220.

Auxiliary circuit 302 includes a first signal coupler 304 and a second signal coupler 312 that are each coupled to an input of a multiple input RF switching device 306, such as a multiplexer or multiple RF switches coupled at their outputs to an RF combiner. RF switching device 306 is coupled to a demodulator 308 that, in turn, is coupled to an analog-to-digital converter (A/D) 310. RF switching device 306 is further coupled to a controller, preferably processor 110, that controls the operation of the switching device.

First signal coupler 304, preferably a directional coupler, is further coupled to an output of RF power amplifier 210. Signal coupler 304 samples amplified signal 211 to produce a sampled amplified signal 305 and conveys the sampled amplified signal to demodulator 308 via RF switching device 306. Demodulator 308 downconverts sampled amplified signal 305 to baseband to produce a baseband amplified signal 309. Demodulator 308 conveys baseband amplified signal 309 to A/D 310. A/D 310 digitizes baseband amplified signal 309 to produce a digital amplified signal 311 and conveys digital amplified signal 311 to MABE 220. Based on digital amplified signal 311, which corresponds to the amplified signal 211 produced by RF amplifier 210 in response to input signal 201, and further based on input signal 201, MABE 220 then updates the values or algorithm included in main signal path model 222.

Second signal coupler 312, preferably a directional coupler, is further coupled to an output of signal combiner 212. Second signal coupler 312 samples postdistortion amplifier output signal 213 to produce a sampled postdistortion amplifier output signal 313 and conveys sampled output signal 313 to demodulator 308 via RF switching device 306. Demodulator 308 downconverts sampled postdistortion amplifier output signal 313 to baseband to produce a baseband postdistortion amplifier output signal 314. Demodulator 308 conveys baseband output signal 314 to A/D 310. A/D 310 digitizes baseband postdistortion amplifier output signal 314 to produce a digital postdistortion amplifier output signal 315 and conveys digital output signal 315 to MABE 220. Based on digital postdistortion amplifier output signal 315, which corresponds to the output signal 213 produced by postdistortion amplifier 200 in response to input signal 201, and further based on input signal 201, MABE 20 then updates the values or algorithm included in main signal path model 222 in order to minimize any residual distortion remaining in output signal 213.

By providing an auxiliary circuit 302 that feeds back a sampled version 313 of postdistortion amplifier output signal 213 to MABE 220, postdistortion amplifier 300 provides for a dynamic updating of main signal path model 222 of MABE 220. By dynamically updating the main signal path model 222, postdistortion amplifier 200 is better able to minimize any residual distortion remaining in output signal 213 and is further able to self-adjust to any changes that may occur in conditions in which the amplifier operates, such as variations in an ambient temperature or an aging of amplifier components such as RF power amplifier 210 and error amplifier 234.

Figure 4:
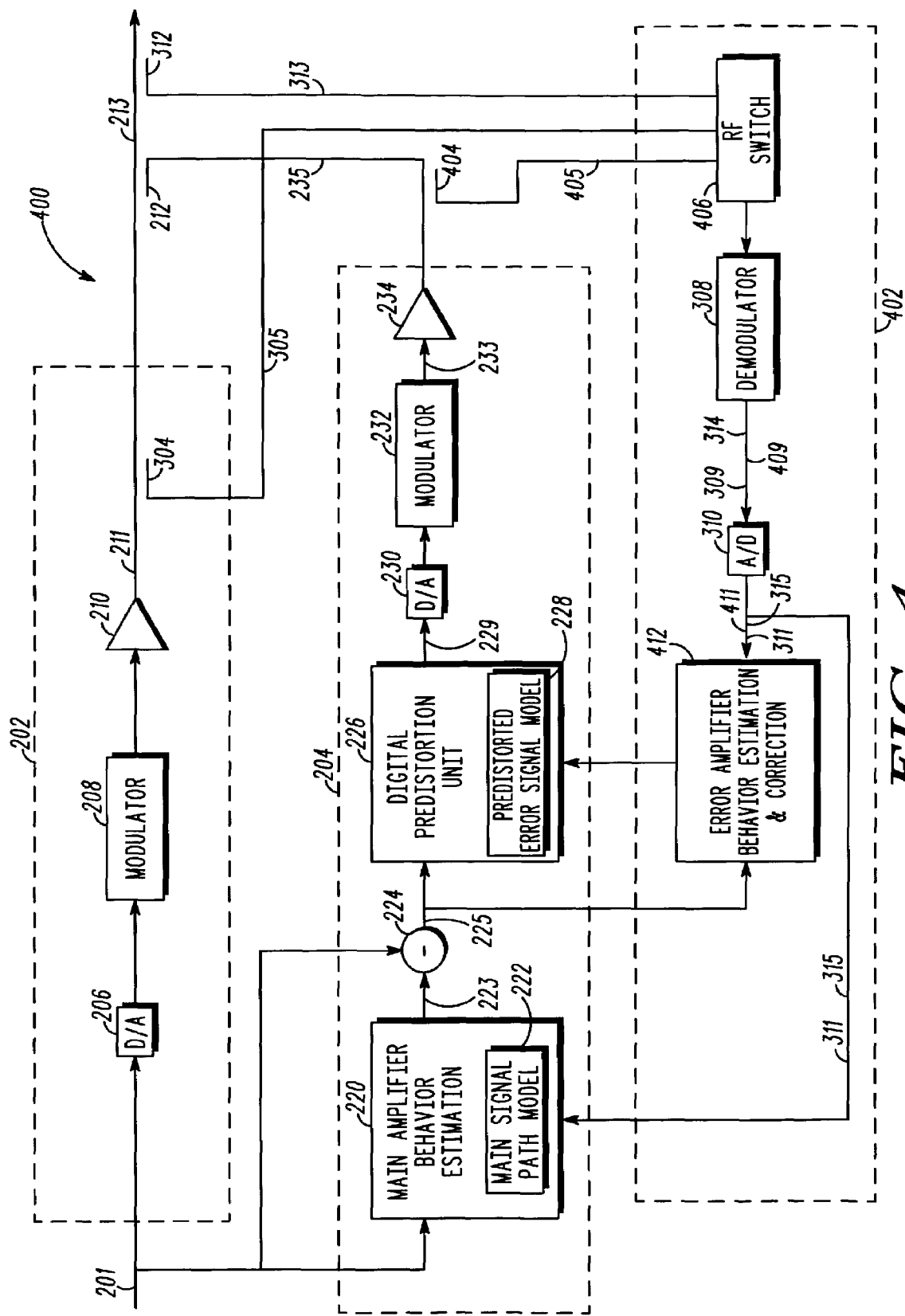
FIG. 4 is a block diagram of a postdistortion amplifier in accordance with another embodiment of the present invention.

FIG. 4 is a block diagram of a postdistortion amplifier 400 in accordance with another embodiment of the present invention. Similar to postdistortion amplifier 200, postdistortion amplifier 400 includes a main signal path 202 that produces an output signal 211 in response to receiving an input signal 201. In addition, similar to postdistortion amplifier 200, forward amplifier 400 includes a postdistortion correction circuit 204 that is coupled to main signal path 200 and that produces an amplified error signal 235 in response to reception of input signal 201. However, unlike postdistortion amplifier 200, postdistortion amplifier 400 further includes a second auxiliary circuit 402 that is coupled to each of main signal path 202 and postdistortion correction circuit 204 and that that facilitates a dynamic updating of main signal path model 222 of MABE 220 and a dynamic updating of predistorted error signal model 228.

Similar to first auxiliary circuit 302, second auxiliary circuit 402 includes first signal coupler 304 and second signal coupler 312. Signal couplers 304 and 312 are each coupled to a multiple input RF switching device 406, such as a multiplexer or multiple RF switches coupled at their outputs to an RF combiner. First signal coupler 304 is further coupled to an output of RF power device 210, while second signal coupler 304 is further coupled to signal combiner 212. RF switching device 406 is coupled to a demodulator 308 and to a controller, preferably processor 110, that controls the operation of the switching device. Demodulator 308 is further coupled to an analog-to-digital converter (A/D) 310, and A/D 310 is further coupled to MABE 220. Similar to first auxiliary circuit 302, and as described in detail above in regard to the first auxiliary circuit, second auxiliary circuit 402 facilitates a dynamic updating of main signal path model 222 of MABE 220 in order to minimize any residual distortion remaining in output signal 213.

However, unlike first auxiliary circuit 302, second auxiliary circuit 402 further includes a third signal coupler 404 that is coupled to an input of RF switching device 406 and further includes an Error Amplifier Behavior Estimation and Correction unit (EABEC) 412 that is coupled to A/D 310. Preferably, EABEC 412 is embodied in processor 110 and the functions of EABEC 412 are performed by the execution, by processor 110, of algorithms stored in the one or more memory devices 112 or in a memory associated with processor 110.

Auxiliary circuit 402 facilitates a dynamic updating of predistorted error signal model 228 by modeling, or characterizing, the path of error signal 225 through predistortion correction circuit 204 based on error signal 225 and amplified error signal 235. Third signal coupler 404, preferably a directional coupler, is further coupled to an output of error amplifier 234. Signal coupler 404 samples amplified error signal 235 to produce a sampled amplified error signal 405 and conveys the sampled amplified error signal to demodulator 308 via RF switching device 406. Demodulator 308 downconverts sampled amplified error signal 405 to baseband to produce a baseband amplified error signal 409. Demodulator 308 conveys baseband amplified error signal 409 to A/D 310. A/D 310 digitizes baseband amplified error signal 409 to produce a digital amplified error signal 411 and conveys digital signal 411 to EABEC 412.

In addition to receiving digital amplified error signal 411 from A/D 310, EABEC 412 also receives error signal 225, produced by summation junction 224, from postdistortion correction circuit 204. Based on error signal 225 and digital amplified error signal 411, EABEC 412 dynamically models, or characterizes, a behavior of a propagation path of error signal 225 through postdistortion correction circuit 204, that is, a behavior of predistortion unit 226, D/A 230, modulator 232, and error amplifier 234. By dynamically modeling a behavior of a propagation path of error signal 225 through postdistortion correction circuit 204, postdistortion amplifier 400 is able to adapt to changes in the behavior of error amplifier 234 over time and maintain an optimal cancellation of distortion components introduced to amplified error signal 235 by error amplifier 234.

EABEC 412 dynamically models, or characterizes, a behavior of a propagation path of error signal 225 through postdistortion correction circuit 204 by comparing error signal 225 to digital amplified error signal 411. Preferably, signals 225 and 411 are synchronized by calibrating a propagation path of amplified error signal 225 through postdistortion correction circuit 204 and auxiliary circuit 402 to EABEC 412. In one embodiment of the present invention, the propagation path is calibrated by passing a low power wide bandwidth signal through the propagation path wherein a resulting frequency response is an actual calibration vector. The low power wide bandwidth signal is stored in a processor of communication device 100, such as processor 110, and is upconverted and then applied to the propagation path. The process of calibration may occur during design or factory testing of postdistortion amplifier 400, and may be repeated by communication device 100 during the course of operation of the communication device. Those who are of ordinary skill in the art realize that there are many other techniques for synchronizing signals 225 and 411, which other techniques may be used herein without departing from the spirit and scope of the present invention.

In one embodiment of the present invention, EABEC 412 models, or characterizes, the propagation path of error signal 225 by plotting a magnitude and a phase of digital amplified error signal 411 against a respective magnitude and a phase of error signal 225. Ideally the plot should produce a linear relationship, and therefore any part of digital amplified error signal 411 that deviates from a line may be considered to represent distortion introduced to the digital amplified error signal by postdistortion correction circuit 204. The distortion corresponds to any residual distortion in amplified error signal 235 that is not cancelled by the predistortion of error signal 225. In another embodiment of the present invention, EABEC 412 may combine error signal 225 and the digital amplified error signal 411, preferably subtracting the error signal from the digital amplified error signal. Ideally, the subtraction of error signal 225 from digital amplified error signal 411 results in a cancellation of an error component of the digital amplified error signal 411 by the error signal. Cancellation of the error component results in an isolation of the distortion introduced to the digital amplified error signal by postdistortion correction circuit 204.

Based on the residual distortion determined by EABEC 412, postdistortion amplifier 400, preferably EABEC 412 or predistortion unit 226, adjusts the predistortion parameters stored in predistorted error signal model 228 in order to optimize amplified error signal distortion cancellation.

In yet another embodiment of the present invention, EABEC 412, after initially modeling the propagation path as described above, may dynamically adjust model 228 based on digital amplified signal 311 and/or digital postdistortion amplifier output signal 315. Based on digital amplified signal 311 and/or digital postdistortion amplifier output signal 315, EABEC 412 may dynamically adjust the parameters or algorithm stored in predistorted error signal model 228 in order to minimize any residual distortion remaining in output signal 213.

By providing an auxiliary circuit 402 that feeds back a sampled version 305 of amplified signal 211 and a sampled version 313 of postdistortion amplifier output signal 213 to each of MABE 220 and EABEC 412, and further feeds back a sampled version 405 of amplified error signal 235 to EABEC 412, postdistortion amplifier 300 provides for a dynamic updating of one or both of a characterization of at least a portion of the main signal path and a characterization of at least a portion of the predistortion correction circuit. By dynamically updating the characterizations of the main signal path and the predistortion correction circuit, postdistortion amplifier 200 is better able to adjust to changes in operating conditions of the amplifier, maintaining optimal cancellation of distortion components introduced to the error signal by error amplifier 234 and minimizing any residual distortion remaining in output signal 213 regardless of the operating conditions.

Figure 5:
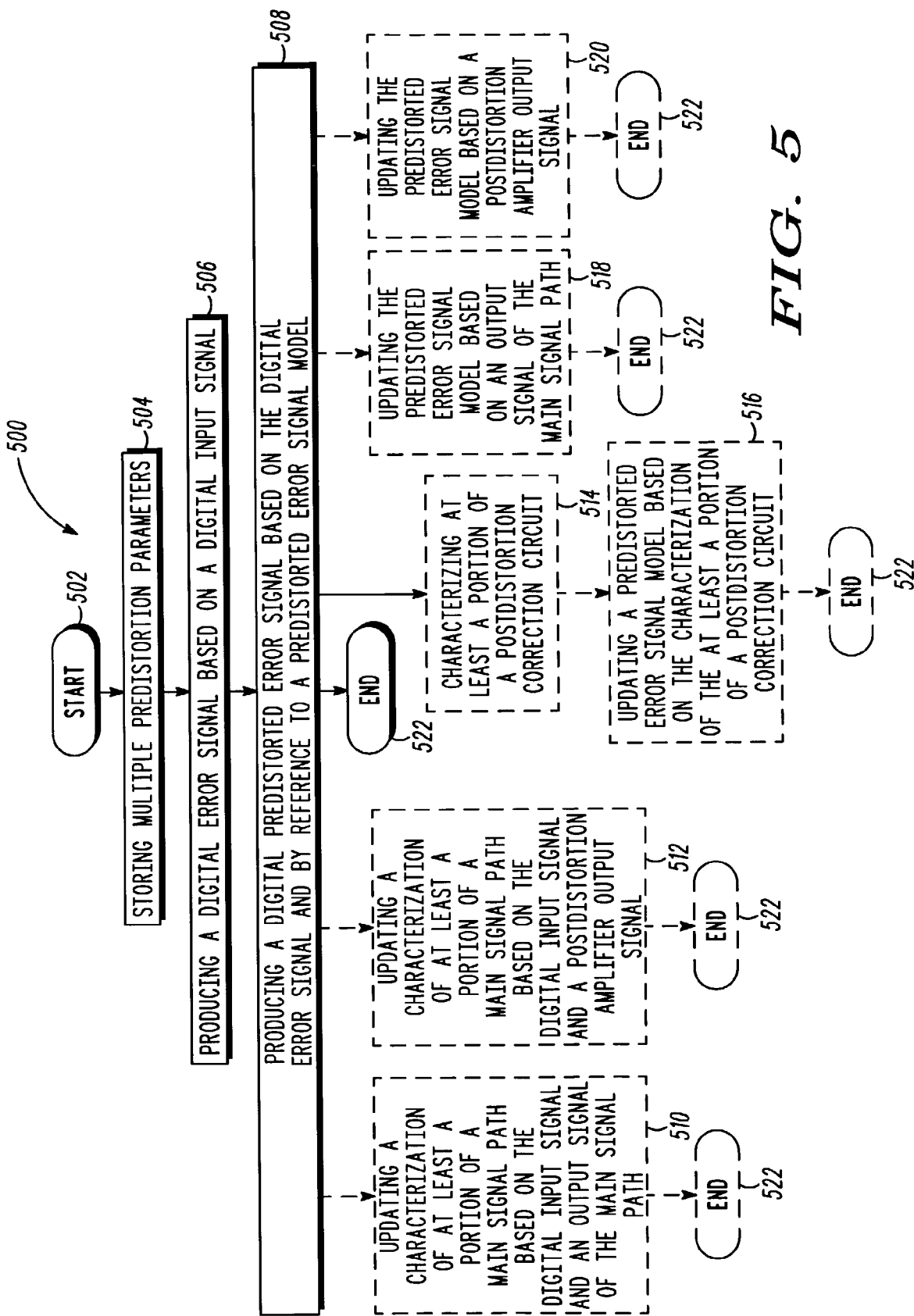
FIG. 5 is a logic flow diagram of steps executed by a postdistortion amplifier to predistort an error signal in accordance with an embodiment of the present invention.

FIG. 5 is a logic flow diagram 500 of steps executed by a postdistortion amplifier in predistorting an error signal in accordance with an embodiment of the present invention, wherein the postdistortion amplifier receives a digital input signal 201 and produces a linearized amplified signal 213 based on the digital input signal. Logic flow diagram 500 begins (502) when the postdistortion amplifier, preferably a predistorted error signal model 228 in a postdistortion correction circuit 204, maintains (504) a predistorted error signal model 228. In one embodiment of the present invention, predistorted error signal model comprises multiple error signal parameters, preferably multiple error signal amplitude and phases, and corresponding multiple predistortion signal parameters, preferably multiple predistortion signal amplitude and phases, that are stored in a look-up table, which look-up table may have a memory component. In another embodiment of the present invention, in addition to storing multiple error signal parameters, predistorted error signal model 228 stores corresponding multiple predistorted error signal parameters, preferably multiple predistorted error signal amplitude and phases. In other embodiments of the present invention, predistorted error signal model 228 may comprise a look-up table with a memory component or may comprise an algorithm, or an algorithm with a memory component, wherein the algorithm produces a predistortion signal parameter or a predistorted error signal parameter when an error signal parameter is input into the algorithm.

Postdistortion amplifier, preferably postdistortion correction circuit 204, produces (506) a digital error signal 225 based on a digital input signal 201 received by the postdistortion amplifier. Preferably, the step of producing a digital error signal includes the following steps. A main amplifier behavior estimation unit (MABE) 220 included in the postdistortion correction circuit 204 characterizes, or models, a main signal path 202 of the postdistortion amplifier to produce a main signal path characterization. The postdistortion amplifier stores the main signal path characterization in a main signal path model 222. The postdistortion amplifier routes digital input signal 201 to MABE 220 and the MABE, in response to receiving the digital input signal, produces a digital estimate 223 of the complex baseband component of the signal output by the main signal path, that is, amplified signal 211, based on the received digital input signal and the main signal path characterization stored in main signal path model 222. MABE 220 then conveys digital estimated signal 223 to a summation junction 224. The postdistortion amplifier also routes the digital input signal to summation junction 224, and the summation junction combines the digital input signal 201 received by the summation junction with digital estimated signal 223 to produce the digital error signal 225.

Upon producing digital error signal 225, postdistortion amplifier, in particular postdistortion correction circuit 204, conveys the digital error signal to a digital predistortion unit 226. Based on digital error signal 225, digital predistortion unit 226 produces (508) a digital predistorted error signal by reference to predistorted error signal model 228, and the logic flow ends (522). In one embodiment of the present invention, the step of maintaining (504) a predistorted error signal model may include a step of maintaining, in predistorted error signal model 228, multiple error signal parameters and multiple corresponding predistortion signal parameters. The step of producing (508) a digital predistorted error signal may then include the following steps. Digital predistortion unit 226 determines at least one parameter of error signal 225. Digital predistortion unit 226 then determines at least one predistortion signal parameter based on the determined at least one error signal parameter and by reference to the error signal parameters and corresponding predistortion signal parameters stored in model 228. Digital predistortion unit 226 then combines the at least one determined error signal parameter and the at least one determined predistortion signal parameter to produce the digital predistorted error signal.

In another embodiment of the present invention, the step of maintaining (504) a predistorted signal model may include a step of maintaining, by predistorted error signal model 228, multiple error signal parameters and multiple corresponding predistorted error signal parameters. The step of producing (508) a digital predistorted error signal may then include the following steps. Digital predistortion unit 226 determines at least one parameter of the error signal 225. Digital predistortion unit 226 then determines at least one predistorted error signal parameter based on the determined at least one error signal parameter and by reference to the error signal parameters and corresponding predistorted error signal parameters stored in model 228. Digital predistortion unit 226 then produces a predistorted error signal based on the determined at least one predistorted error signal parameter.

In yet another embodiment of the present invention, the step of maintaining (504) a predistorted signal model may include a step of maintaining, by predistorted error signal model 228, a algorithm that generates at least one predistortion signal parameter or at least one predistorted error signal parameter in response to an input to the algorithm of at least one error signal parameter. When the algorithm generates a predistortion signal parameter, the step of producing (508) a digital predistorted error signal may then include steps of determining at least one predistortion signal parameter based on the determined at least one error signal parameter and by reference to model 228, and combining the at least one determined error signal parameter and the at least one determined predistortion signal parameter to produce the digital predistorted error signal. When the algorithm generates a predistorted error signal parameter, the step of producing (508) a digital predistorted error signal may then include steps of determining at least one predistorted error signal parameter based on the determined at least one error signal parameter and by reference to model 228, and producing a predistorted error signal based on the determined at least one predistorted error signal parameter.

In still another embodiment of the present invention, the postdistortion amplifier may update (510) the characterization of main signal path 202 based on digital input signal 201 and main signal path output signal 211. Preferably, the step of updating (510) the main signal path characterization includes the following steps. A signal coupler 304 samples the signal output by the main signal path, that is, amplified signal 211, to produce a sampled main signal path output signal 305. A demodulator 308 in an auxiliary circuit 302 that is coupled to each of main signal path 202 and to predistortion correction circuit 204 demodulates sampled main signal path signal 305 to produce a baseband main signal path output signal, and an A/D 310 in the auxiliary circuit digitizes the baseband main signal path output signal to produce a digital main signal path output signal. MABE 220 in predistortion correction circuit 204 then updates the main signal path characterization based on the digital input signal and the digital main signal path output signal.

In yet another embodiment of the present invention, the postdistortion amplifier may update (512) the characterization of main signal path 202 based on digital input signal 201 and postdistortion amplifier output signal 213. Preferably, the step of updating (512) the main signal path characterization includes the following steps. A signal coupler 312 samples postdistortion amplifier output signal 213 to produce a sampled postdistortion amplifier output signal 313. A demodulator 308 in an auxiliary circuit 302 that is coupled to each of main signal path 202 and to predistortion correction circuit 204 demodulates sampled postdistortion amplifier output signal 313 to produce a baseband postdistortion amplifier output signal, and an A/D 310 in the auxiliary circuit digitizes the baseband postdistortion amplifier output signal to produce a digital postdistortion amplifier output signal. MABE 220 in predistortion correction circuit 204 then updates the main signal path characterization based on the digital input signal and the digital postdistortion amplifier output signal.

In still another embodiment of the present invention, the postdistortion amplifier, may characterize (514) at least a portion of a propagation path of error signal 225 through postdistortion correction circuit 204, preferably characterizing predistortion unit 226, D/A 230, modulator 232, and error amplifier 234, and may update (516) predistorted error signal model 228 based on the characterization of the at least a portion of the error signal propagation path.

Preferably the step of characterizing (514) at least a portion of a propagation path of error signal 225 through postdistortion correction circuit 204 includes the following steps. The predistorted error signal produced by predistortion unit 226 is converted to an analog signal by D/A 230 and modulated onto an RF carrier by modulator 232. Error amplifier 234 then amplifies the analog, modulated error signal to produce an amplified error signal. A signal coupler 404 in an auxiliary circuit 402 of postdistortion amplifier samples the amplified error signal to produce a sampled amplified error signal. The sampled amplified error signal is converted to baseband by a demodulator in auxiliary circuit 402 and an A/D 410 in the auxiliary circuit digitizes the baseband amplified error signal to produce a digital amplified error signal based on the sampled amplified error signal. Error amplifier behavior estimation and correction unit (EABEC) 412 then characterizes the at least a portion of postdistortion correction circuit 204 based on the digital error signal and the digital amplified error signal. In still another embodiment of the present invention, the postdistortion amplifier, preferably either EABEC 412 or predistortion unit 226, may further update (516) predistorted error signal model 228 based on the characterization of the at least a portion of postdistortion correction circuit 204.

In still other embodiments of the present invention, the postdistortion amplifier may update (518) predistorted error signal model 228 based on main signal path output signal 211, or may update (520) the predistorted error signal model based on postdistortion amplifier output signal 213.

In sum, a communication device is provided that includes a postdistortion amplifier that digitally predistorts an error signal, thereby providing compensation for the distortion introduced into an amplified version of the error signal by an error amplifier. By compensating for the distortion introduced into the amplified error signal, the postdistortion amplifier reduces the distortion introduced to a postdistortion amplifier output signal by the amplified error signal. The communication device, and in particular the postdistortion amplifier, further provides for a dynamic updating of one or both of a characterization of at least a portion of a main signal path of the postdistortion amplifier and a characterization of at least a portion of the postdistortion correction circuit of the postdistortion amplifier. By dynamically updating the characterizations of the main signal path and the postdistortion correction circuit, the postdistortion amplifier is better able to adjust to changes in operating conditions that may impact the cancellation of distortion introduced by the postdistortion amplifier to a signal coupled to the postdistortion amplifier, and thereby impact the linearity of the signal output by the postdistortion amplifier.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus for predistorting an error signal in a postdistortion amplifier comprising:
    a predistorted error signal model; and
    a digital predistortion unit that receives a digital error signal and produces a digital predistorted error signal based on the received digital error signal and by reference to the predistorted error signal model.

2. The apparatus of claim 1, wherein the predistorted error signal model comprises a look-up table in which is stored a plurality of predistortion parameters.

3. The apparatus of claim 1, wherein the predistorted error signal model comprises an algorithm.

4. The apparatus of claim 1, wherein the predistorted error signal model generates at least one predistortion signal parameter based on at least one error signal parameter and wherein, in response to receiving an error signal, the digital predistortion unit determines at least one parameter of the received error signal, determines at least one predistortion signal parameter based on the determined at least one parameter of the received error signal and by reference to the predistorted error signal model, and combines the determined at least one parameter of the received error signal with the determined at least one predistortion signal parameter to produce the digital predistorted error signal.

5. The apparatus of claim 1, wherein the predistorted error signal model generates at least one predistortion signal parameter based on at least one error signal parameter and wherein, in response to receiving an error signal, the digital predistortion unit determines at least one parameter of the received error signal, determines at least one parameter of the predistorted error signal based on the determined at least one parameter of the received error signal and by reference to the predistorted error signal model, and produces a predistorted error signal based on the determined at least one parameter of the predistorted error signal.

6. The apparatus of claim 1, further comprising an error amplifier behavior estimation and correction unit operably coupled to the digital predistortion unit that characterizes a propagation path of the error signal and updates the predistorted error signal model based on the propagation path characterization.

7. The apparatus of claim 1, further comprising an error amplifier behavior estimation and correction unit operably coupled to the digital predistortion unit that characterizes a propagation path of the error signal and wherein the digital predistortion unit updates the predistorted error signal model based on the characterization of the propagation path by the error amplifier behavior estimation and correction unit.

8. The apparatus of claim 1, further comprising an auxiliary circuit coupled to the digital predistortion unit that feeds back a sample of an amplified version of the error signal, and wherein the digital predistortion unit updates the predistorted error signal model based on the sample of the amplified version of the error signal.

9. The apparatus of claim 1, further comprising an auxiliary circuit coupled to the digital predistortion unit and to a main signal path that feeds back at least one of a sample of an amplified version of an input signal coupled to the main signal path and a postdistortion amplifier output signal, and wherein the digital predistortion unit updates the predistorted error signal model based on the at least one fed back sample.

10. The apparatus of claim 1, wherein the postdistortion amplifier comprises a main signal path coupled to a postdistortion correction circuit, wherein the postdistortion correction circuit produces a digital error signal based on a digital input signal coupled to the postdistortion correction circuit and amplifies the error signal to produce an amplified error signal, and wherein the apparatus further comprises:
    a second signal coupler that samples the amplified error signal to produce a sampled amplified error signal;
    a demodulator operably coupled to the signal coupler that demodulates the sampled amplified error signal to produce a baseband amplified error signal;
    an analog-to-digital converter (A/D) operably coupled to the demodulator that digitizes the baseband amplified error signal to produce a digital amplified error signal; and
    an error amplifier behavior estimation and correction unit operably coupled to the A/D that receives at least a portion of the digital error signal, characterizes at least a portion of the postdistortion correction circuit based on the received at least a portion of the digital error signal and the digital amplified error signal, and provides for updating of the predistorted error signal model based on the characterization of the at least a portion of the postdistortion correction circuit.

11. The apparatus of claim 1, wherein the postdistortion amplifier comprises a main signal path that produces a main signal path output signal in response to a coupling of a digital input signal to the main signal path and wherein the apparatus further comprises:
    a main amplifier behavior estimation unit that stores a characterization of the main signal path of the postdistortion amplifier and produces a digital estimate of the signal output by the main signal path in response to receiving at least a portion of the digital input signal; and a summation junction operably coupled to each of the main amplifier behavior estimation unit and the digital predistortion unit, wherein the summation junction receives at least a portion of the digital input signal and combines the digital input signal and the digital estimate of a signal output by the main signal path to produce the error signal.

12. The apparatus of claim 11, further comprising an auxiliary circuit coupled to each of the main signal path and the main amplifier behavior estimation unit, wherein the auxiliary circuit feeds back to the main amplifier behavior estimation unit at least one of a sample of the main signal path output signal and a sample of a postdistortion amplifier output signal, and wherein the main amplifier behavior estimation unit updates the characterization of the main signal path of the postdistortion amplifier based on the at least one fed back sample.

13. The apparatus of claim 11, further comprising:
a signal coupler that samples the signal output by the main signal path to produce a sampled main signal path output signal;
a demodulator operably coupled to the signal coupler that demodulates the sampled main signal path output signal to produce a baseband main signal path output signal;
an analog-to-digital converter (A/D) operably coupled to the demodulator and the main amplifier behavior estimation unit that digitizes the baseband main signal path output signal to produce a digital main signal path output signal; and
wherein the main amplifier behavior estimation unit updates the characterization of the main signal path of the postdistortion amplifier based on the digital input signal and the digital main signal path output signal.

14. The apparatus of claim 11, further comprising:
a signal coupler that samples a signal output by the postdistortion amplifier to produce a sampled postdistortion amplifier output signal;
a demodulator operably coupled to the signal coupler that demodulates the sampled postdistortion amplifier output signal to produce a baseband postdistortion amplifier output signal;
an analog-to-digital converter (A/D) operably coupled to the demodulator and the main amplifier behavior estimation unit that digitizes the baseband postdistortion amplifier output signal to produce a digital postdistortion amplifier output signal; and
wherein the main amplifier behavior estimation unit updates the characterization of the main signal path of the postdistortion amplifier based on the digital input signal and the digital postdistortion amplifier output signal.

15. A method for predistorting an error signal in a postdistortion amplifier that receives a digital input signal and produces a linearized amplified signal based on the digital input signal, wherein the method comprises steps of:
maintaining a predistorted error signal model;
producing a digital error signal based on the digital input signal; and
producing a digital predistorted error signal based on the received digital error signal and by reference to the predistorted error signal model.

16. The method of claim 15, wherein the step of maintaining a predistorted error signal model comprises a step of maintaining at least one error signal parameter and a corresponding at least one predistortion signal parameter, and wherein the step of producing a digital predistorted error signal comprises steps of:
determining at least one parameter of the digital error signal;
determining at least one predistortion signal parameter based on the determined at least one parameter of the digital error signal and by reference to the stored at least one error signal parameter and corresponding at least one predistortion signal parameter; and
combining the determined at least one parameter of the received error signal and the determined at least one predistortion signal parameter to produce the digital predistorted error signal.

17. The method of claim 15, wherein the step of maintaining a predistorted error signal model comprises a step of storing at least one error signal parameter and corresponding at least one predistorted error signal parameter and wherein the step of producing a digital predistorted error signal comprises steps of:
determining at least one parameter of the digital error signal;
determining at least one parameter of the predistorted error signal based on the determined at least one parameter of the digital error signal and by reference to the stored at least one error signal parameter and corresponding at least one predistorted error signal parameter; and
producing a predistorted error signal based on the determined at least one parameter of the predistorted error signal.

18. The method of claim 15, further comprising steps of:
characterizing at least a portion of a propagation path of the error signal; and
updating the stored at least one error signal parameter and corresponding at least one predistorted error signal parameter based on the characterization of the at least a portion of the error signal propagation path.

19. The method of claim 18, wherein the step of characterizing at least a portion of a propagation path of the error signal comprises steps of:
amplifying the error signal to produce an amplified error signal;
sampling the amplified error signal to produce a sampled amplified error signal;
producing a digital amplified error signal based on the sampled amplified error signal; and
characterizing at least a portion of the postdistortion correction circuit based on the digital error signal and the digital amplified error signal.

20. The method of claim 19, further comprising a step of updating a predistorted error signal model based on the characterization of the at least a portion of the postdistortion correction circuit.

21. The method of claim 15, further comprising steps of:
amplifying the error signal to produce an amplified error signal;
sampling the amplified error signal to produce a sampled amplified error signal; and
updating the predistorted error signal model based on the sampled amplified error signal.

22. The method of claim 15, further comprising steps of:
sampling of an amplified version of an input signal coupled to a main signal path of the postdistortion amplifier to produce a sampled amplified input signal; and updating the predistorted error signal model based on the sampled amplified input signal.

23. The method of claim 15, further comprising steps of:
sampling a postdistortion amplifier output signal to produce a sampled postdistortion amplifier output signal; and
updating the predistorted error signal model based on the sampled postdistortion amplifier output signal.

24. The method of claim 15, wherein the step of producing a digital error signal comprises steps of:
characterizing a main signal path of the postdistortion amplifier to produce a main signal path characterization;
receiving a digital input signal;
producing a digital estimate of a signal output by the main signal path based on the received digital input signal and the main signal path characterization; and
combining the digital input signal and the digital estimate of a signal output by the main signal path to produce the digital error signal.

25. The method of claim 24, further comprising steps of:
sampling a signal output by a main signal path of the postdistortion amplifier to produce a sampled main signal path output signal; and
updating the main signal path characterization based on the sampled main signal path output signal.

26. The method of claim 24, wherein the step of characterizing a main signal path of the postdistortion amplifier to produce a main signal path characterization further comprising steps of:
sampling a signal output by a main signal path of the postdistortion amplifier to produce a sampled main signal path output signal;
demodulating the sampled main signal path output signal to produce a baseband main signal path output signal;
digitizing the baseband main signal path output signal to produce a digital main signal path output signal; and
updating the main signal path characterization based on the digital input signal and the digital main signal path output signal.

27. The method of claim 24, wherein the step of characterizing a main signal path of the postdistortion amplifier to produce a main signal path characterization further comprising steps of:
sampling a signal output by the postdistortion amplifier to produce a sampled postdistortion amplifier output signal;
demodulating the sampled postdistortion amplifier output signal to produce a baseband postdistortion amplifier output signal;
digitizing the baseband postdistortion amplifier output signal to produce a digital postdistortion amplifier output signal; and
updating the main signal path characterization based on the digital input signal and the digital postdistortion amplifier signal.

28. A postdistortion amplifier comprising:
a main signal path that receives a digital input signal and produces an amplified signal in response to receiving the digital input signal;
a postdistortion correction circuit that is coupled to the main signal path, wherein the postdistortion correction circuit receives at least a portion of the digital input signal, maintains a characterization of the main signal path, produces a digital error signal based on the at least a portion of the digital input signal and the characterization of the main signal path, predistorts the digital error signal based on a predistorted error signal model to produce a digital predistorted error signal, and produces an amplified error signal based on the predistorted error signal, wherein the predistortion of the error signal at least partially cancels distortion introduced by the postdistortion correction circuit to the amplified error signal; and
a signal combiner coupled to the main signal path and to the postdistortion correction circuit that receives the amplified signal from the main signal path, receives the amplified error signal from the postdistortion correction circuit, and combines the amplified signal with the amplified error signal to produce a postdistortion amplifier output signal.

29. The postdistortion amplifier of claim 28, wherein the postdistortion correction circuit comprises:
a predistorted error signal model; and
a digital predistortion unit that produces the digital predistorted error signal based on the digital error signal and by reference to the predistorted error signal model.

30. The postdistortion amplifier of claim 29, wherein the predistorted error signal model comprises a look-up table in which is stored at least one predistortion parameter.

31. The postdistortion amplifier of claim 29, wherein the predistorted error signal model comprises an algorithm.

32. The postdistortion amplifier of claim 28, wherein the postdistortion correction circuit further comprises:
a main amplifier behavior estimation unit that receives at least a portion of the digital input signal, maintains a characterization of the main signal path of the postdistortion amplifier, and produces a digital estimate of the signal output by the main signal path in response to a coupling of the digital input signal to the main amplifier behavior estimation unit; and
a summation junction operably coupled to each of the main amplifier behavior estimation unit and the digital predistortion unit, wherein the summation junction receives at least a portion of digital input signal and combines the digital input signal and the digital estimate of a signal output by the main signal path to produce the error signal.

33. The postdistortion amplifier of claim 28, further comprising an auxiliary circuit coupled to each of the main signal path and the postdistortion correction circuit, wherein the auxiliary circuit receives at least a portion of the signal output by the main signal path and produces a digital version of the signal output by the main signal path based on the received at least a portion of the signal output by the main signal path, and wherein the postdistortion amplifier updates the characterization of the main signal path based on the digital input signal and the digital version of the signal output by the main signal path.

34. The postdistortion amplifier of claim 28, further comprising an auxiliary circuit coupled to each of the main signal path, the postdistortion correction circuit, and the signal combiner, wherein the auxiliary circuit receives at least a portion of the postdistortion amplifier output signal and produces a digital version of the postdistortion amplifier output signal based on the received at least a portion of the postdistortion amplifier output signal, and wherein the postdistortion amplifier updates the characterization of the main signal path based on the digital input signal and the digital version of the postdistortion amplifier output signal.

35. The postdistortion amplifier of claim 28, further comprising an auxiliary circuit coupled to the postdistortion correction circuit, wherein the auxiliary circuit receives at least a portion of the digital input signal and at least a portion of the amplified error signal and wherein the postdistortion amplifier updates the predistorted error signal model based on the at least a portion of the digital input signal and at least a portion of the amplified error signal.

36. The postdistortion amplifier of claim 28, further comprising an auxiliary circuit coupled to the postdistortion correction circuit, wherein the auxiliary circuit receives at least a portion of the digital input signal and at least a portion of the amplified error signal and produces a digital amplified error signal based on the at least a portion of the amplified error signal, characterizes at least a portion of the postdistortion correction circuit based on the received at least a portion of the digital error signal and the digital amplified error signal, and wherein the postdistortion amplifier updates the predistorted error signal model based on the characterization of the at least a portion of the postdistortion correction circuit.

37. The postdistortion amplifier of claim 28, further comprising an auxiliary circuit coupled to the digital predistortion unit and to a main signal path that feeds back at least one of a sample of an amplified version of an input signal coupled to the main signal path and a sample of a postdistortion amplifier output signal, and wherein the digital predistortion unit updates the predistorted error signal model based on the at least one fed back sample.

38. A wireless communication device comprising:
an information source that sources information to a processor;
a processor that receives the information from the information source, produces a digital input signal based on the received information, and couples the digital input signal to a postdistortion amplifier;
a postdistortion amplifier that receives the digital input signal from the processor and produces a linearized amplified signal based on the digital input signal, the postdistortion amplifier comprising:
  a main signal path that receives the digital input signal and produces an amplified signal in response to receiving the digital input signal;
  a postdistortion correction circuit that is coupled to the main signal path, wherein the postdistortion correction circuit receives at least a portion of the digital input signal, maintains a characterization of the main signal path, maintains a predistorted error signal model, produces a digital error signal based on the at least a portion of the digital input signal and the characterization of the main signal path, predistorts the digital error signal based on the predistorted error signal model to produce a digital predistorted error signal, and produces an amplified error signal based on the predistorted error signal, wherein the predistortion of the error signal at least partially cancels distortion introduced by the postdistortion correction circuit to the amplified error signal; and
  a signal combiner coupled to the main signal path and to the postdistortion correction circuit that receives the amplified signal from the main signal path, receives the amplified error signal from the postdistortion correction circuit, and combines the amplified signal with the amplified error signal to produce a linearized amplified signal.

39. The wireless communication device of claim 38, further comprising an auxiliary circuit coupled to each of the main signal path and the postdistortion correction circuit, wherein the auxiliary circuit receives at least a portion of the signal output by the main signal path and produces a digital version of the signal output by the main signal path based on the received at least a portion of the signal output by the main signal path, and wherein the postdistortion amplifier updates the characterization of the main signal path based on the digital input signal and the digital main signal path output signal.

40. The wireless communication device of claim 38, further comprising an auxiliary circuit coupled to each of the main signal path, the postdistortion correction circuit, and the signal combiner, wherein the auxiliary circuit receives at least a portion of the linearized amplified signal and produces a digital version of the linearized amplified signal based on the received at least a portion of the linearized amplified signal, and wherein the postdistortion amplifier updates the characterization of the main signal path based on the digital input signal and the digital linearized amplified signal.

41. The wireless communication device of claim 38, further comprising an auxiliary circuit coupled to the postdistortion correction circuit, wherein the auxiliary circuit receives at least a portion of the digital input signal and at least a portion of the amplified error signal, and wherein the postdistortion amplifier updates the predistorted error signal model based on the at least a portion of the digital input signal and at least a portion of the amplified error signal.

* * * * *